(12) United States Patent
Wojciechowski et al.

(10) Patent No.: US 11,509,112 B2
(45) Date of Patent: Nov. 22, 2022

(54) MIXED-SIGNAL FREQUENCY CONTROL LOOP FOR TUNABLE LASER

(71) Applicant: Robert Bosch GmbH, Stuttgart (DE)

(72) Inventors: Ken Wojciechowski, Cupertino, CA (US); Behnam Behroozpour, South San Francisco, CA (US)

(73) Assignee: Robert Bosch GmbH, Stuttgart (DE)

( * ) Notice: Subject to any disclaimer, the term of this patent is extended or adjusted under 35 U.S.C. 154(b) by 186 days.

(21) Appl. No.: 16/772,374

(22) PCT Filed: Dec. 7, 2018

(86) PCT No.: PCT/EP2018/083990
§ 371 (c)(1),
(2) Date: Jun. 12, 2020

(87) PCT Pub. No.: WO2019/121069
PCT Pub. Date: Jun. 27, 2019

(65) Prior Publication Data
US 2021/0083449 A1    Mar. 18, 2021

Related U.S. Application Data

(60) Provisional application No. 62/608,667, filed on Dec. 21, 2017.

(51) Int. Cl.
*H01S 3/106* (2006.01)
*H01S 3/13* (2006.01)

(52) U.S. Cl.
CPC ............. *H01S 3/1062* (2013.01); *H01S 3/13* (2013.01)

(58) Field of Classification Search
CPC ........ H01S 3/1062; H01S 3/13; H01S 5/0085; H01S 5/0071; H01S 5/06213;
(Continued)

(56) References Cited

U.S. PATENT DOCUMENTS

| 4,900,112 A * | 2/1990 | Kawachi | ............ G02B 6/29353 |
| | | | 385/141 |
| 9,705,283 B1 * | 7/2017 | Deppe | ................. H01S 5/18397 |
| 2010/0085992 A1 * | 4/2010 | Rakuljic | ................ G01S 7/4911 |
| | | | 372/20 |

FOREIGN PATENT DOCUMENTS

CA    2 980 954 A1    9/2016

OTHER PUBLICATIONS

International Search Report corresponding to PCT Application No. PCT/EP2018/083990, dated Mar. 21, 2019 (5 pages).
(Continued)

*Primary Examiner* — Xinning(Tom) Niu
(74) *Attorney, Agent, or Firm* — Maginot, Moore & Beck LLP (57) ABSTRACT

A Lidar system includes a tunable laser configured to generate an output light signal and a photodiode array for receiving light from the tunable laser reflected from a target object. The tunable laser includes a feedback loop including a Mach-Zender interferometer, MZI, receiving the output light signal from the tunable laser, in which the MZI includes two optical paths receiving the output light signal. A phase shifter is provided in one optical path that is operable to produce a pre-determined shift in the phase angle of the light signal passing through the one optical path relative to the phase angle of the light signal passing through the other optical path. A photodiode configured to detect the interference signal generated by the MZI is operable to generate a photodiode current in response thereto. Circuitry converts the photodiode current to a control signal for controlling the tunable laser.

15 Claims, 5 Drawing Sheets

(58) Field of Classification Search
CPC ...... H01S 5/0687; G01S 17/34; G01S 7/4911; G01S 17/931; G01S 7/497
See application file for complete search history.

(56) References Cited

OTHER PUBLICATIONS

Satyan, A. et al., "Precise control of broadband frequency chirps using optoelectronic feedback," Optics Express 15991, vol. 17, No. 18, Aug. 31, 2009 (9 pages).

Tu, X. et al., "50-Gb/s silicon optical modulator with traveling wave electrodes," Optics Express 12776, vol. 21, No. 10, May 20, 2013 (7 pages).

Sandborn, P. et al., "Linear Frequency Chirp Generation Employing Opto-electronic Feedback Loop and Integrated Silicon Photonics," CLEO 2013, Optical Society of America (2 pages).

Behroozpour, B. et al., "Electronic-Photonic Integrated Circuit for 3D Microimaging," IEEE Journal of Solid-State Circuits, vol. 52, No. 1, pp. 161-172, Jan. 2017 (12 pages).

Behroozpour, B. et al., "Lidar System Architectures and Circuits," IEEE Communications Magazine, vol. 55, No. 10, pp. 135-142, Oct. 2017 (8 pages).

Iiyama, K. et al., "Linearizing Optical Frequency-Sweep of a Laser Diode for FMCW Reflectometry," Journal of Lightwave Technology, vol. 14, No. 2, pp. 173-178, Feb. 1996 (6 pages).

Bordonalli, A. C. et al., "High-Performance Phase Locking of Wide Linewidth Semiconductor Lasers by Combined Use of Optical Injection Locking and Optical Phase-Lock Loop," Journal of Lightwave Technology, vol. 17, No. 2, pp. 328-342, Feb. 1999 (15 pages).

Azadeh, S. S. et al., "Low $V\pi$ Silicon photonics modulators with highly linear epitaxially grown phase shifters," Optics Express 23526, vol. 23, No. 18, Sep. 7, 2015 (25 pages).

\* cited by examiner

High-Level 3D Camera Architecture

FIG. 1

Methods for Frequency Modulation of Light

MIXED-SIGNAL FREQUENCY CONTROL LOOP FOR TUNABLE LASER

CROSS-REFERENCE TO RELATED APPLICATION

This application is a 35 U.S.C. § 371 National Stage Application of PCT/EP2018/083990, filed on Dec. 7, 2018, which claims the benefit of priority to U.S. provisional patent application No. 62/608,667, filed on Dec. 21, 2017, the entire disclosures of which are incorporated herein by reference.

BACKGROUND

Figure 1:
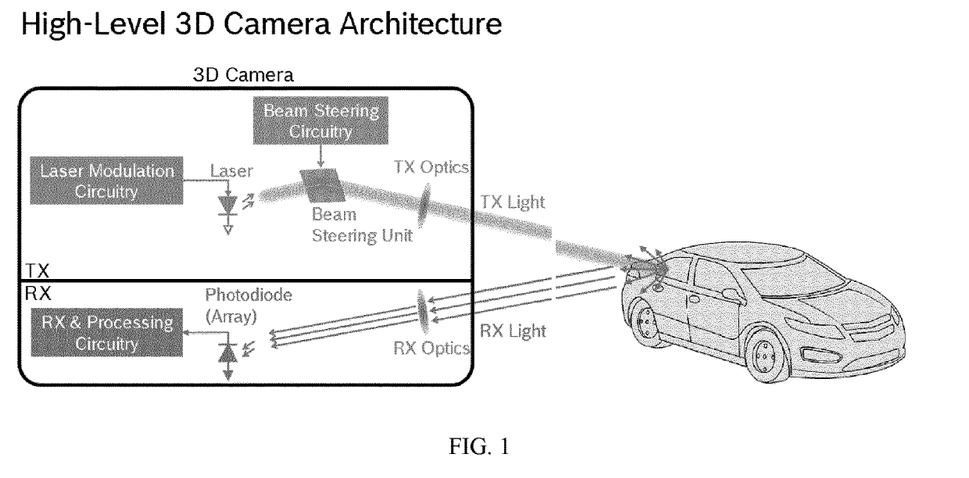
FIG. 1 is a diagram of a 3D camera architecture.

High-level three-dimensional (3D) cameras have been developed that are capable of scanning a scene or object and developing a very accurate 3D model or image. Some 3D cameras use Lidar (light imaging, detection and ranging) that uses a pulsed laser to measure ranges or distances. The typical Lidar system, as shown in FIG. 1, includes a scanning transmitter that transmits the laser light (TX light) and a receiver for receiving the reflected light (RX light) that includes a photoreceptor, such as a photodiode. The transmitter includes laser modulation circuitry and beam steering circuitry to control the operation of the laser. Signals from the photoreceptor are fed to processing circuitry that converts the incoming signals to usable data.

Figure 2A:
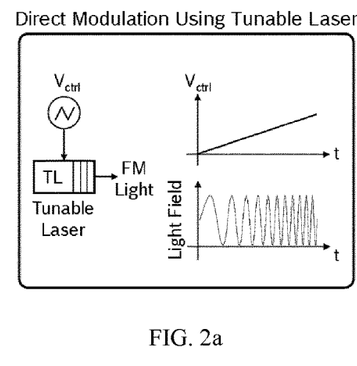
FIG. 2a is a diagram of direct frequency modulation of light using a tunable laser.
Figure 2B:
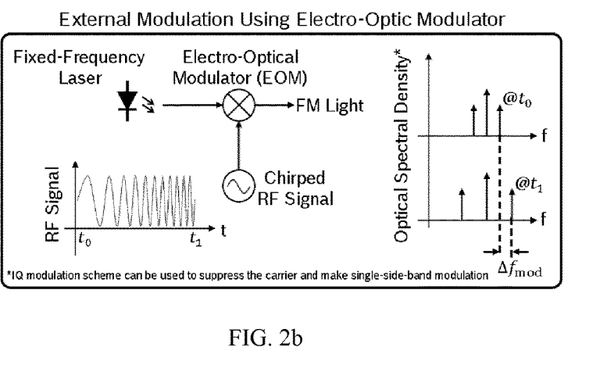
FIG. 2b is a diagram of external frequency modulation of light using an electro-optic modulator.
Figure 3A:
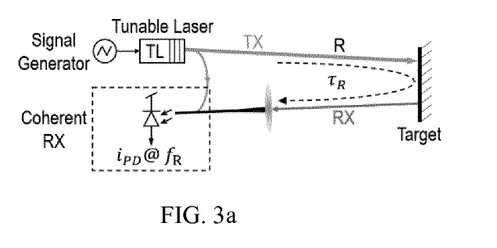
FIG. 3a is a diagram of FMCW Lidar architecture using a tunable laser TL system.
Figure 3B:
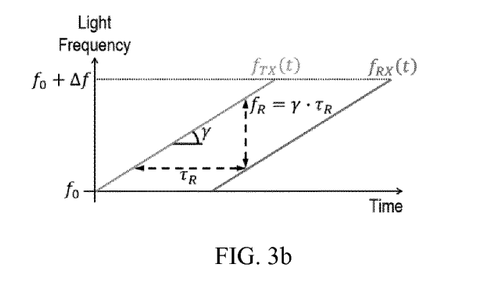

Lidar uses frequency-modulated continuous-wave (FMCW) laser light. FIG. 2 shows two approaches to frequency modulation of laser light, namely direct modulation using a tunable laser as shown in FIG. 2a, and external modulation using an electro-optic modulator as shown in FIG. 2b. Due to the overall complexity of the external modulation approach, most Lidar systems utilize direct modulation of a tunable laser. An example of FMCW Lidar architecture using a tunable laser TL is shown in FIGS. 3a, b. In this example the FMCW light TX is sent to a target. By measuring the round-trip-delay of this light-wave to the target $\tau_R$ and assuming a constant speed for light c in the measurement medium, the target distance R can be determined according to Equation 1 as:

$$R = 1/2 c \cdot \tau_R \qquad (1)$$

The reflected light RX from the target is collected and combined with source light (as represented by the thin line between the TX and RX beams). The time delay between the reflected light and the source light causes a frequency difference $f_R$ that is proportional to the round-trip delay $\tau_R$ and the modulation slope $\gamma$, as shown in the graph in FIG. 3b. Combining the source light and reflected light in a shared medium, such as in a waveguide or in free-space, causes interference between them. This interference goes through periodic constructive and destructive phases that repeat at the frequency $f_R$. These phases appear as a periodic increase and decease in the optical power level in the shared medium. A photodetector can be used to convert this optical power to an electric current $i_{PD}$ (FIG. 3a) so that this periodic increase and decrease in optical power appears as a modulation of the electric current that can be measured using electronic circuits. Combining Equation 1 with the relation shown in FIG. 3b results in the following Equation 2:

$$R = \frac{1}{2} c \cdot \tau_R = \frac{1}{2\gamma} c \cdot f_R \qquad (2)$$

Figure 4:
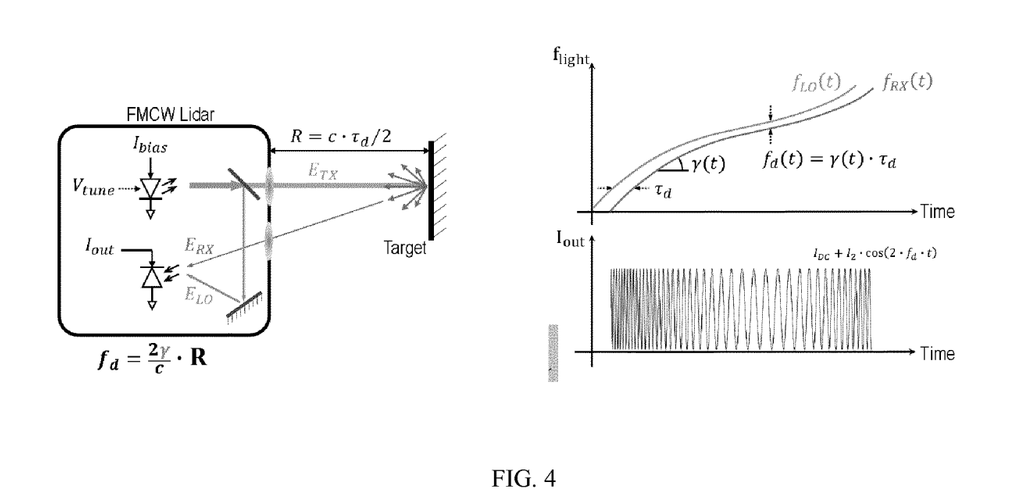
FIG. 4 is a diagram of ramp non-linearity and drift in ranging with direct modulation.

In this example, the range error R depends on the measurement precision of the frequency $f_R$. The range error R also depends on any error in the control (or alternatively observation) of the modulation slope $\gamma$. Examples of the effects of range error, as well as ramp non-linearity, in direct modulation systems are depicted in FIG. 4.

In many applications of FMCW laser systems, such as fiber defect detection, the precise control of the modulation pattern (such as modulation slope $\gamma$ for a linear frequency modulation) is of central importance for the system performance. For this reason a feedback technique has been utilized based on well-known electronic phase-locked loop (PLL) control, examples of which are described in the following publications, all of which are expressly incorporated herein by reference: K. Iiyama, L.-T. Wang and K.-i. Hayashi, "Linearizing Optical Frequency-Sweep of a Laser Diode for FMCW Reflectometry," *Journal of Lightwave Technology*, pp. 173-178, 1996; A. C. Bordonalli, C. Walton and A. J. Seeds, "High-Performance Phase Locking of Wide Linewidth Semiconductor Lasers by Combined Use of Optical Injection Locking and Optical Phase-Lock Loop," *Journal of Lightwave Technology*, vol. 17, no. 2, pp. 328-342, 1999; N. Satyan, A. Vasilyev, G. Rakuljic, V. Leyva and A. Yariv, "Precise control of broadband frequency chirps using optoelectronic feedback," *Optics Express*, vol. 17, no. 18, pp. 15991-1599, 2009; and. Behroozpour, P. A. Sandborn, N. Quack, T.-J. Seok, Y. Matsui, M. C. Wu and B. E. Boser, "Electronic-Photonic Integrated Circuit for 3D Microimaging," *IEEE Journal of Solid-State Circuits*, vol. 52, no. 1, pp. 161-172, 2017.

Figure 5A:
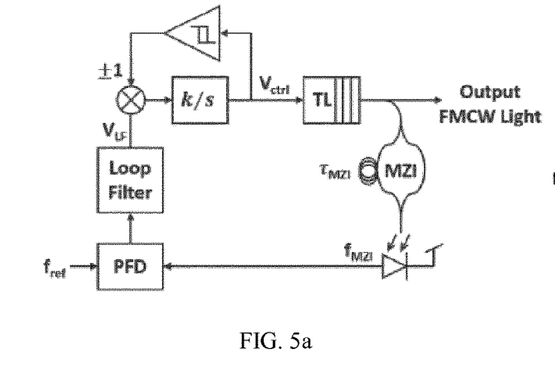
FIG. 5a is a diagram of an exemplary PLL control system with a frequency-tunable laser.

An exemplary PLL control system is shown in FIG. 5a. In this system, a fraction of the frequency-tunable-laser (TL) light is taken to be processed and used in a feedback loop to control its frequency. This light is fed in the feedback loop to an asymmetric Mach-Zehnder interferometer (MZI) which includes a splitter at its input that splits the optical power and sends it into two light paths or waveguides with different lengths. The longer waveguide causes an extra delay $\tau_{MZI}$ in the light propagating through it, which acts similarly to a range measurement setup in which an extra delay is caused by the round-trip of the light to a target. The light from each of the shorter and longer waveguides is then combined at the output of the MZI. Similar to the case of FMCW Lidar in FIG. 3a, the delay between the light from the two branches causes a frequency difference between them equal to $f_{MZI}$ according to the following Equation 3:

$$f_{MZI} = \gamma \cdot \tau_{MZI} \qquad (3)$$

Figure 5B:
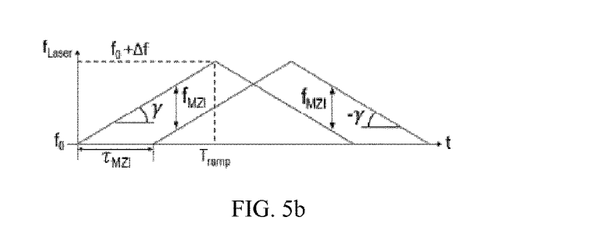

Since the MZI delay is fixed by the length of the waveguide, any change in the frequency $f_{MZI}$ can be interpreted as variations in the modulation slope $\gamma$. Therefore, ensuring that $f_{MZI}$ is fixed to a reference value in the feedback loop can ensure a constant modulation slope. The frequency $f_{MZI}$ can be fixed to a reference value $f_{ref}$ using a well-known electronic phase-locked loop (PLL) circuit, as shown in FIG. 5a. The PLL circuit shown in this figure includes a hysteresis comparator to limit the level of the control signal applied to the laser. This feature is desired because the laser frequency and the laser control signal ($V_{CTRL}$) cannot increase on an indefinite ramp. Therefore, once the control signal reaches a certain level (upper or lower limit) defined by the hysteresis comparator, the comparator output toggles and switches the slope of the ramp (from up-ramp to down-ramp, or vice versa) to keep the control signal and laser frequency within the limits. This feature causes the modulation signal to repeat with up or down ramps with the period $T_{ramp}$, as shown in the signal graph of FIG. 5b.

While the PLL controller shown in FIG. 5a provides an effective technique for some systems, it has certain limitations in many practical cases. In particular, a problem can arise when the differential time delay ($\tau_{MZI}$) between the two MZI waveguide branches cannot be sufficiently long, such as when the controller is integrated onto a photonic chip with small functional area. From Equation 3 it can be seen that reducing the time delay ($\tau_{MZI}$) reduces the MZI frequency $f_{MZI}$ which translates to a decrease in the number of cycles of the MZI beat signal within one modulation ramp ($n=f_{MZI}\cdot T_{ramp}$). It can be shown that the number of cycles n is only a function of $\tau_{MZI}$ and the maximum laser frequency change Δf according to Equation 4:

$$n = f_{MZI} \cdot T_{ramp} = \gamma \cdot \tau_{MZI} \cdot T_{ramp} = \frac{\Delta f}{T_{ramp}} \cdot \tau_{MZI} \cdot T_{ramp} = \Delta f \cdot \tau_{MZI} \quad 4$$

Having a small value for number of cycles n is problematic because a PLL circuit usually samples the phase of its input signal at zero-crossings. Therefore, reducing n reduces the number of samples available to the feedback loop within one modulation ramp period. With a small number of samples the control loop does not have enough information to provide an accurate control signal through the feedback mechanism.

As an example, when using a laser with 1 GHz modulation depth (Δf=1 GHz) and an MZI of 0.5 ns delay (which corresponds to about 10 cm waveguide length on a silicon-photonic chip with a footprint slightly less than 1 sq-mm when laid out in a spiral shape) the number of cycles within one ramp period will be less than one (n=1 GHz×0.5 ns=0.5). In other words, the feedback loop may not have even a single sample of the MZI beat signal to observe the laser frequency slope and to provide any meaningful feedback to control it. In most practical cases the MZI signal should have at least tens of cycles within each ramp period to ensure a reasonable operation for the control loop. There is a significant need to address this problem by providing an improved feedback architecture to observe and control the laser frequency, as disclosed herein.

SUMMARY OF THE DISCLOSURE

In one aspect of the disclosure, a Lidar (light imaging, detection and ranging) system is provided that comprises a tunable laser configured to generate an output light signal and a photodiode array for receiving light from the tunable laser reflected from a target object. The tunable laser includes a feedback loop including a Mach-Zender interferometer (MZI) receiving the output light signal from the tunable laser in which the MZI includes two optical paths receiving the output light signal. A phase shifter is provided in one optical path that is operable to produce a pre-determined shift in the phase angle of the light signal passing through the one optical path relative to the phase angle of the light signal passing through the other optical path. A photodiode configured to detect the interference signal generated by the MZI is operable to generate a photodiode current in response thereto. Circuitry converts the photodiode current to a control signal for controlling the tunable laser.

In one embodiment, the phase shifter is configured to provide a π/2 bias to the phase angle of the light signal passing through the one optical path. In another embodiment, the phase shifter is configured to bias the phase angle of the light signal passing through the one optical path as a function of the photodiode current, which is in turn a function of the interference signal generated by the MZI.

In another aspect, a method is contemplated for providing an output light signal for a Lidar (light imaging, detection and ranging) system including the steps of operating a tunable laser to generate an output light signal and directing the output light signal to a Mach-Zender interferometer (MZI), the MZI including two optical paths receiving the output light signal. A pre-determined phase shift is introduced into the phase angle of the light signal passing through one optical path relative to the phase angle of the light signal passing through the other optical path. The interference signal generated by the MZI is detected with a photodetector and a photodiode current is generated in response thereto. The photodiode current is processed to generate a control signal for controlling the tunable laser.

DESCRIPTION OF THE FIGURES

FIG. 3b is a graph of the light frequency generated by the system shown in FIG. 3a.

FIG. 5b is a graph of the laser frequency generated by the exemplary system shown in FIG. 5a.

FIG. 8a is a schematic of a system implementing a mixed-signal electronic feedback loop for a laser frequency-tuning method according to the present disclosure.

FIG. 8b is a graph of the light frequency produced by the system shown in FIG. 8a.

DETAILED DESCRIPTION

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles disclosed herein as would normally occur to one skilled in the art to which this disclosure pertains.

Figure 6:
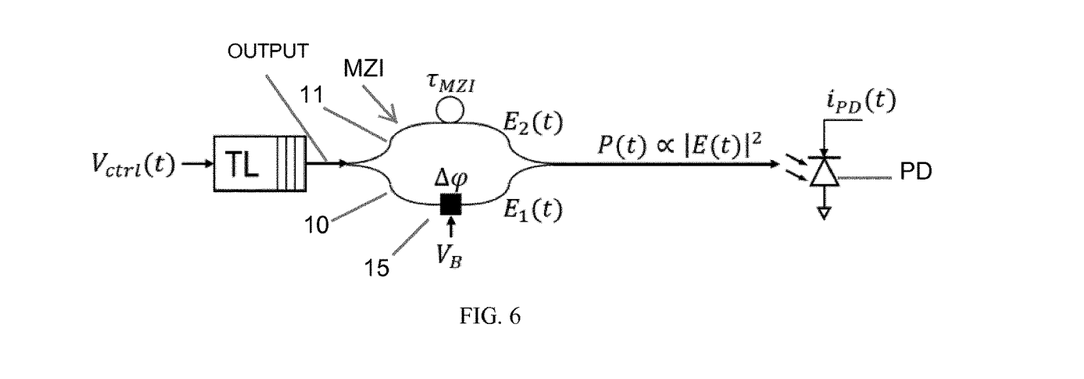
FIG. 6 is a schematic of an FM/AM conversion using a phase-biased Mach-Zender interferometer and a photodiode, according to one aspect of the present disclosure.

The present disclosure contemplates a Lidar system that uses a feedback system and method to map the frequency modulation (FM) of the laser light to an amplitude modulation or variation (AM) on the current of a photodetector to provide a feedback signal for a Lidar (rather than mapping it to a beat frequency like $f_{MZI}$). One implementation of the FM to AM conversion is illustrated in FIG. 6. A control signal $V_{ctrl}$ applied to a tunable laser TL causes a frequency shift in the output light that then passes through a Mach-Zehnder interferometer MZI with the MZI providing a 50:50 power split between a first arm or path 10 and second arm or path 11. The second path 11 introduces a fixed delay $\tau_{MZI}$. In one aspect of the present disclosure, a phase shifter 15, configured to introduce a phase shift $\Delta\varphi$, is provided in the first path 10. In one specific embodiment, the first path 10 can be shorter than the second path 11. The interference signal P(t) is detected by the photodiode PD according to the following Equation 5:

$$\begin{aligned}i_{PD}(t) &= k_{PD}(t) \cdot P(t) \propto k_{PD}(t) \cdot E(t) \cdot E^*(t) \\ &= k_{PD}(t) \cdot (E_1(t) + E_2(t)) \cdot (E_1(t) + E_2(t))^* \\ &= k_{PD}(t)\left(\frac{1}{\sqrt{2}}E_0 e^{j\varphi_1} + \frac{1}{\sqrt{2}}E_0 e^{j\varphi_2}\right) \cdot \left(\frac{1}{\sqrt{2}}E_0 e^{j\varphi_1} + \frac{1}{\sqrt{2}}E_0 e^{j\varphi_2}\right)^* \\ &= k_{PD}(t) \cdot P_0 \cdot (1 + \cos(\varphi_2 - \varphi_1))\end{aligned}$$

where $k_{PD}$ is the photodiode responsivity, $P_0$ is the incident optical power, $\varphi_2$ is the phase angle of the light signal passing through the second path 11 of the MZI and $\varphi_1$ is the shifted phase angle of the light signal passing through the first path 10.

For a piecewise linear modulation (i.e., a constant modulation slope $\gamma$ during the time delay $\tau_{MZI}$), the argument of the cosine function at the end of Equation 5 can be simplified as shown in Equation 6 below:

$$\begin{aligned}\varphi_2 - \varphi_1 &= -\Delta\varphi + 2\pi \int_t^{t+\tau_{MZI}} f(t)' dt \\ &= -\Delta\varphi + 2\pi \int_t^{t+\tau_{MZI}} \gamma t' dt' \\ &= 2\pi\gamma\tau_{MZI} \cdot t + \pi\gamma\tau_{MZI}^2 - \Delta\varphi\end{aligned} \quad 6$$

The first term $2\pi\gamma\tau_{MZI}\cdot t$ shows the variation of the signal at the MZI output that can be used as a measure in the feedback loop. The second term $\pi\gamma\tau_{MZI}^2$ is an unwanted term that appears as a bias. The greatest sensitivity in the amplitude of the sinusoidal versus its phase occurs at its zero-crossing. Therefore, the argument of the cosine function should have a bias of $\pi/2$ for maximum sensitivity, and the phase shifter $\Delta\varphi$ should be adjusted to ensure the following relationship in Equation 7:

$$\pi\gamma\tau_{MZI}^2 - \Delta\varphi = \frac{\pi}{2} \Rightarrow \Delta\varphi = \pi\left(\gamma\tau_{MZI}^2 - \frac{1}{2}\right) \quad 7$$

For example, if the modulation slope $\gamma$ is 1 GHz/10 μs and $\tau$ is 100 ps, then the term $\gamma\tau_{MZI}^2$ would be $10^{-6}$ which can be neglected when compared to ½. In this case, the phase shifter in the first path 10 controls the phase bias of the MZI. In accordance with the present disclosure, the phase shifter 15 for the shorter MZI branch 11 can be implemented as disclosed in X. Tu, T.-Y. Liow, J. Song, X. Luo, Q. Fang, M. Yu and G.-Q. Lo, "50-Gb/s silicon optical modulator with traveling wave electrodes," *Optics Express*, vol. 21, no. 10, pp. 12776-12782, 2013, or as described in S. Sharif Zadeh, M. Florian, S. Romero-Garcia, A. Moscoso-Martir, N. von den Driesch, J. Muller, S. Mantl, D. Buca and J. Witzens, "Low Vπ Silicon photonics modulators with highly linear epitaxially grown phase shifters," *Optics Express*, vol. 23, no. 18, pp. 23526-23550, 2015, the entire disclosures of which are incorporated herein by reference. In particular, Section 2 of the Tu et al. article and Section 2 of the Zadeh et al. article are specifically incorporated herein by reference to describe the construction of an MZI phase shifter for use with the present disclosure.

With a bias of $$\Delta\varphi = \frac{\pi}{2},$$

Figure 7:
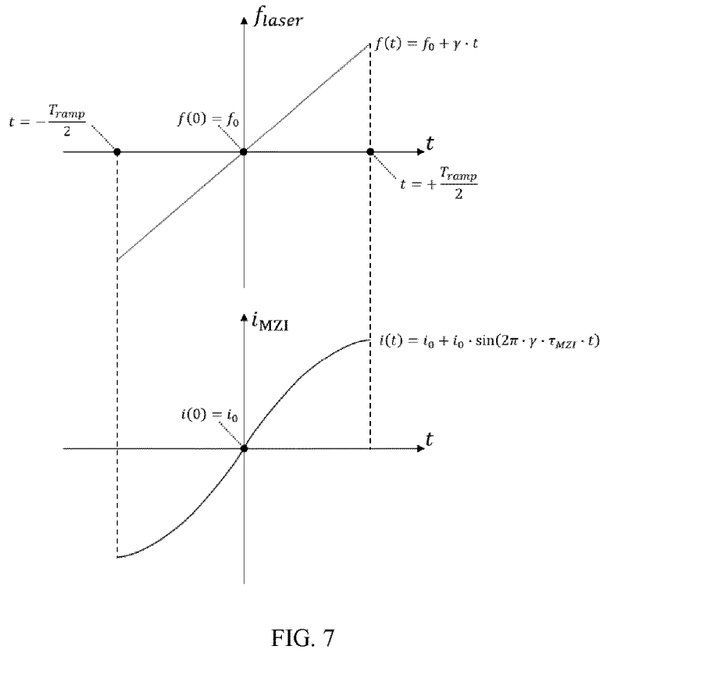
FIG. 7 is a graph of the photocurrent generated by the diode in the system shown in FIG. 6.

Equation 5 can be approximated as given below in Equation 8:

$$i_{PD}(t) = i_0 \cdot (1 + \sin(2\pi\gamma\tau_{MZI}\cdot t)) \quad 8$$

where $k_{PD}(t)\cdot P_0$ from Equation 5 has been replaced with $i_0$. As an example, for $\Delta f=1$ GHz and $\tau_{MZI}=500$ ps, the photocurrent will then look like a half period of a sinusoidal as shown in FIG. 7.

Figures 8A, 8B:
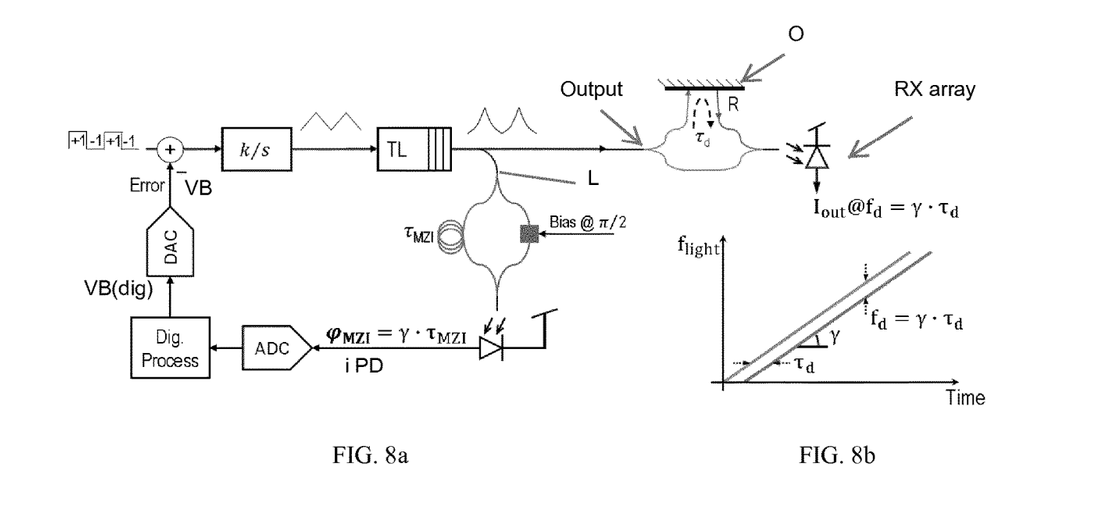

The laser frequency-tuning method of the present disclosure can be implemented in a mixed-signal electronic feedback system as shown in FIG. 8a. The tunable laser TL produces an output light signal that is reflected from a detected object O, which reflected light signal is detected by appropriate detection circuitry RXarray. The output light signal includes a signal loop L that incorporates the Mach-Zender interferometer MZI of FIG. 6. According to the present method, the measured frequency tuning shape through the photocurrent $i_{PD}(t)$ is digitized by an analog-to-digital converter ADC and processed by a digital processor, as shown in FIG. 8a, in the digital domain to produce a digital control signal $V_B(\text{dig})$. In one embodiment, the digital processor is configured and operable to compare the digital signal from the ADC to a predefined ideal waveform for controlling the tunable laser and to generate a digital error signal. The resulting digital error signal is then conditioned to provide a control waveform for use in control of the tunable laser. This signal $V_B(\text{dig})$ is converted to an analog signal $V_B$ using a digital-to-analog converter DAC that is fed to the tunable laser TL to control the laser. In an alternative implementation, the addition of the error signal to the square-wave and subsequent integration could also happen in the digital domain, in which case the DAC output would be directly connect to the tunable laser to control it. As reflected in the schematic of FIG. 8a, the phase shifter of the MZI provides a bias $$\Delta\varphi = \frac{\pi}{2}.$$

The frequency tuned output light is shown in the graph of FIG. 8b.

Figure 9:
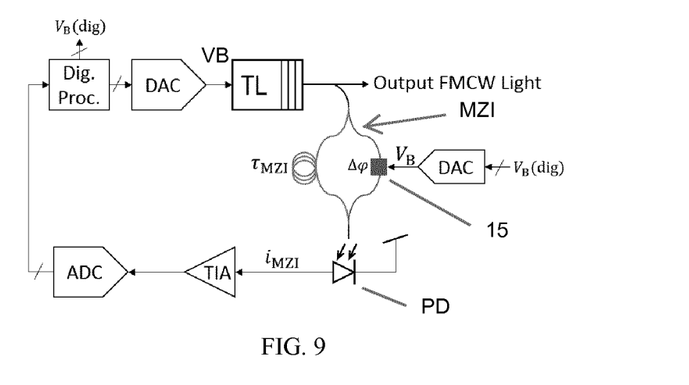
FIG. 9 is a schematic of an alternative system implementing a mixed-signal feedback loop for a laser frequency-tuning method according to the present disclosure.

One challenge in implementing this MZI loop is that the extra phase shift $\Delta\varphi$ is needed in the MZI to ensure maximum sensitivity of the photocurrent versus laser frequency tuning. While this phase shift can be calibrated to be at the optimum point at the beginning of the operation for a given system, the phase shift might have temperature dependency or drift due to aging during the operation of the tunable laser circuit. In one aspect of the present disclosure implemented to avoid this issue, a servo loop can be provided to observe the peak-to-peak value of the photocurrent during each ramp period and to maximize the photocurrent by adjusting the phase change Δφ as a function of the changing $V_B$. Thus, in one embodiment illustrated in the schematic of FIG. 9, this feature is implemented in the feedback loop in the digital domain by providing the digitized signal $V_B$(dig) is passed through a digital-analog converter to the phase-shifter 15 of the MZI. The modulated photocurrent $i_{MZI}$ can pass through a transimpedance amplifier TIA, as shown in FIG. 9, to convert the current to a voltage, which is in turn digitized in the ADC and processed in the digital processor as described above to provide a control signal $V_B$ to the tunable laser TL and to the phase shifter 15 of the Mach-Zehnder interferometer MZI.

Unlike the prior approaches for FM laser control that use electro-optic PLL, the system and method of the present disclosure can achieve a high density of samples in the feedback loop independent of the MZI length or of the laser tuning depth. The systems shown in FIGS. 8a and 9 enable more precise control of the laser frequency which results in superior performance of the overall system. This improved performance makes the system of the present disclosure more suitable for integrated platforms where there is more limitation to the size of the optical components because of cost and other practical issues, such as high on-chip waveguide loss. Finally, the shape of the tuning (e.g. sinusoidal instead of linear) can be easily changed in the digital domain or even can be programmable by software.

Known frequency-modulated continuous-wave (FMCW) laser light has multiple applications including ranging and 3D imaging, fiber defect detection, etc. Such systems operate based on modulating the laser frequency with a known pattern and measuring the delay by which this pattern is observed in an interferometric optical detector. Precision of these systems has a strong dependency on the control or, alternatively, on observation of the laser frequency and its modulation pattern. The present disclosure provides a feedback system with better dynamics compared to the existing FMCW systems. In particular, the present disclosure relies on amplitude variation of the photocurrent in a feedback loop to control the tunable laser TL.

The present disclosure should be considered as illustrative and not restrictive in character. It is understood that only certain embodiments have been presented and that all changes, modifications and further applications that come within the spirit of the disclosure are desired to be protected.

What is claimed is:

1. A Lidar (light imaging, detection and ranging) system comprising:
   a tunable laser configured to generate an output light signal;
   a feedback loop including;
      a Mach-Zender interferometer (MZI) receiving the output light signal, the MZI including;
         a first optical path and a second optical path simultaneously receiving the output light signal; and
         a phase shifter in the first optical path for providing a pre-determined shift in the phase angle of the light signal passing through said first optical path relative to the phase angle of the light signal passing through said second optical path;
      a photodiode configured to detect the interference signal generated by the MZI and generate a photodiode current in response thereto; and
      circuitry configured and operable to process the photodiode current to generate a control signal for controlling the tunable laser; and
   a photodiode array for receiving light from the tunable laser reflected from a target object.

2. The Lidar system of claim 1, wherein the phase shifter is configured to provide a π/2 bias to the phase angle of the light signal passing through the first optical path.

3. The Lidar system of claim 1, wherein the phase shifter is configured to bias the phase angle of the light signal passing through the first optical path as a function of said photodiode current.

4. The Lidar system of claim 3, wherein the phase shifter is configured to bias the phase angle of the light signal passing through the first optical path as a function of said control signal provided from said circuitry.

5. The Lidar system of claim 1, wherein said circuitry includes:
   a transimpedance amplifier receiving said photodiode current and generating an analog voltage signal in response thereto;
   an analog-to-digital converter receiving said analog voltage signal and generating a digital voltage;
   a digital processor operable on said digital voltage to condition the digital voltage for use as a control signal for the tunable laser; and
   a digital-to-analog converter for converting the output signal from the digital processor to said control signal.

6. A method for providing an output light signal for a Lidar (light imaging, detection and ranging) system comprising:
   operating a tunable laser to generate an output light signal;
   directing the output light signal to a Mach-Zender interferometer (MZI), the MZI including a first and a second optical path, each simultaneously receiving the output light signal;
   introducing a pre-determined phase shift into the phase angle of the light signal passing through said first optical path relative to the phase angle of the light signal passing through said second optical path;
   detecting the interference signal generated by the MZI with a photodetector and generating a photodiode current in response thereto; and
   processing the photodiode current to generate a control signal for controlling the tunable laser.

7. The method of claim 6, wherein the phase shift is π/2.

8. The method of claim 6, wherein the phase shift is a function of the photodiode current.

9. The method of claim 8, wherein the phase shift is a function of the control signal.

10. The method of claim 6, wherein the step of processing the photodiode current includes:
    passing the photodiode current through a transimpedance amplifier to generate an analog voltage signal in response thereto;
    convert the analog voltage signal to a digital voltage;
    digital processing the digital voltage to condition the digital voltage for use as a control signal for the tunable laser; and
    converting the output signal from the digital processor to the control signal.

11. A feedback system for a Lidar (light imaging, detection and ranging) system comprising:
- a tunable laser configured to generate an output light signal; and
- a feedback loop including;
  - a Mach-Zender interferometer (MZI) receiving the output light signal, the MZI including;
    - a first optical path and a second optical path simultaneously receiving the output light signal; and
    - a phase shifter in the first optical path for providing a pre-determined shift in the phase angle of the light signal passing through said first optical path relative to the phase angle of the light signal passing through said second optical path;
  - a photodiode configured to detect the interference signal generated by the MZI and generate a photodiode current in response thereto; and
  - circuitry configured and operable to process the photodiode current to generate a control signal for controlling the tunable laser.

12. The feedback system of claim 11, wherein the phase shifter is configured to provide a $\pi/2$ bias to the phase angle of the light signal passing through the first optical path.

13. The feedback system of claim 11, wherein the phase shifter is configured to bias the phase angle of the light signal passing through the first optical path as a function of said photodiode current.

14. The feedback system of claim 13, wherein the phase shifter is configured to bias the phase angle of the light signal passing through the first optical path as a function of said control signal provided from said circuitry.

15. The feedback system of claim 11, wherein said circuitry includes:
- a transimpedance amplifier receiving said photodiode current and generating an analog voltage signal in response thereto;
- an analog-to-digital converter receiving said analog voltage signal and generating a digital voltage;
- a digital processor operable on said digital voltage to condition the digital voltage for use as a control signal for the tunable laser; and
- a digital-to-analog converter for converting the output signal from the digital processor to said control signal.

* * * * *